United States Patent
Vo et al.

(10) Patent No.: US 11,074,956 B1
(45) Date of Patent: Jul. 27, 2021

(54) ARBITRATED SENSE AMPLIFIER

(71) Applicant: Micron Technology, Inc., Boise, ID (US)

(72) Inventors: Huy T. Vo, Boise, ID (US); Ferdinando Bedeschi, Biassono (IT); Suryanarayana B. Tatapudi, Boise, ID (US); Hyunyoo Lee, Boise, ID (US); Adam S. El-Mansouri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/806,942

(22) Filed: Mar. 2, 2020

(51) Int. Cl.
*G11C 11/22* (2006.01)

(52) U.S. Cl.
CPC ........ *G11C 11/2273* (2013.01); *G11C 11/221* (2013.01); *G11C 11/2255* (2013.01); *G11C 11/2257* (2013.01)

(58) Field of Classification Search
CPC ............ G11C 11/2273; G11C 11/2255; G11C 11/221; G11C 11/2257
See application file for complete search history.

(56) References Cited

U.S. PATENT DOCUMENTS

| | | | | |
|---|---|---|---|---|
| 2003/0123276 | A1* | 7/2003 | Yokozeki | G11C 14/0072 365/145 |
| 2011/0305099 | A1* | 12/2011 | Sharma | G11C 7/18 365/203 |
| 2019/0287606 | A1* | 9/2019 | Dozaka | G11C 17/123 |
| 2019/0333562 | A1 | 10/2019 | Vo et al. | |

OTHER PUBLICATIONS

U.S. Appl. No. 16/121,224, filed Sep. 4, 2018 (69 pages).

\* cited by examiner

*Primary Examiner* — Jay W. Radke
(74) *Attorney, Agent, or Firm* — Holland & Hart LLP

(57) ABSTRACT

Methods, systems, and devices for an arbitrated sense amplifier are described. A memory device may couple a memory cell to a first node via a digit line and may couple the first node to a second node. If a voltage at the second node is associated with a first logic value stored at the memory cell, the memory device may couple the second node with a third node and may charge the third node according to the voltage. However, if the voltage at the second node is associated with a second logic value stored at the memory cell, the memory device may not couple the second node with the third node. The memory device may compare the resulting voltage at the third node with a reference voltage and may generate a signal indicative of a logic value stored by the memory cell.

23 Claims, 8 Drawing Sheets

ARBITRATED SENSE AMPLIFIER

BACKGROUND

The following relates generally to one or more memory systems and more specifically to an arbitrated sense amplifier.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic value for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

In some cases, a memory device may perform a read operation on a memory cell. Performing the read operation may involve using a sense amplifier to compare a voltage generated based on a signal from the memory cell with a reference voltage. By performing the comparison, the memory device may be able to determine a logic value stored at the memory cell and may transmit the determined logic value to a host device.

DETAILED DESCRIPTION

Figure 1:
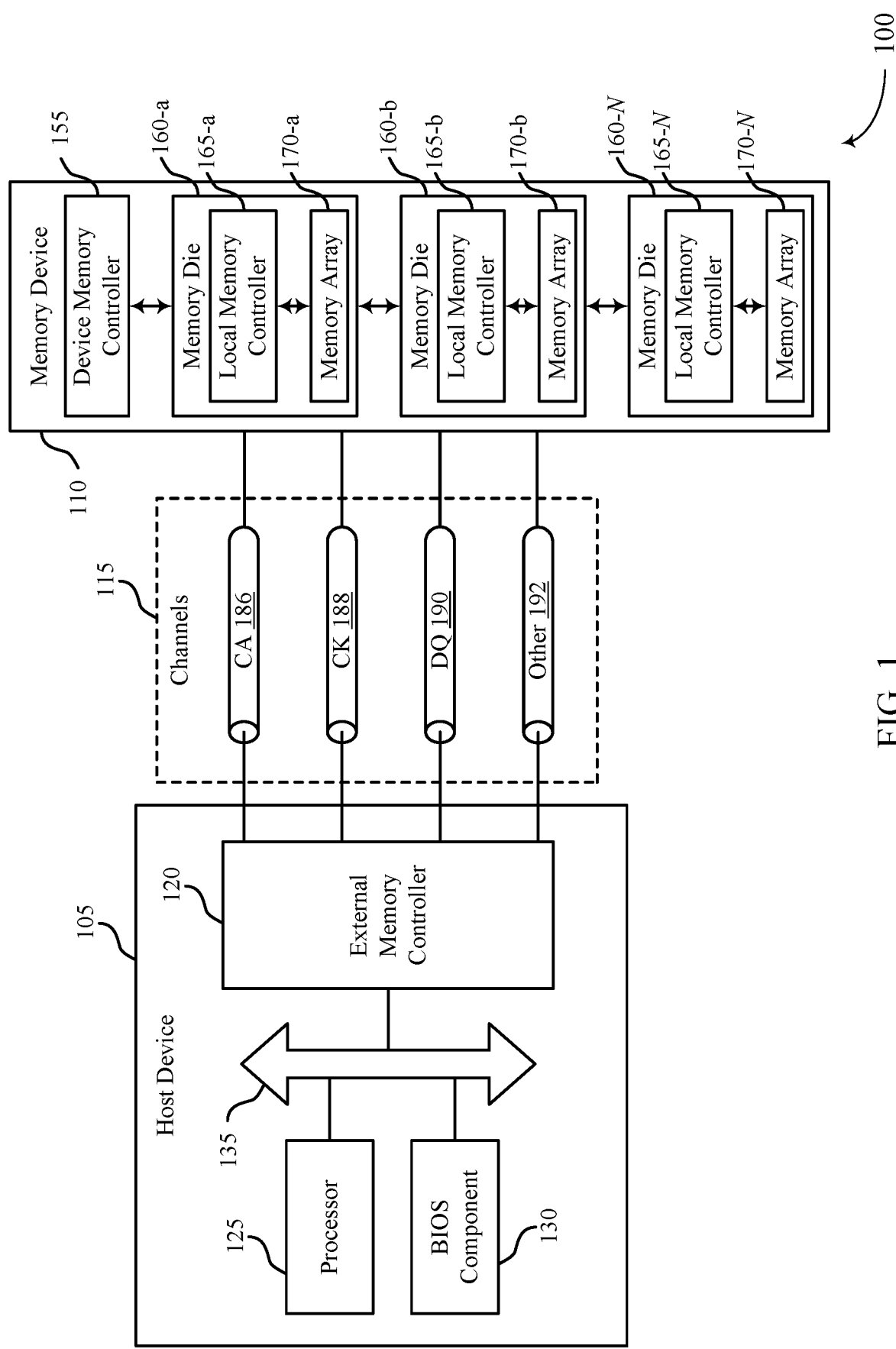
FIG. 1 illustrates an example of a system that supports an arbitrated sense amplifier in accordance with examples as disclosed herein.

Some sensing schemes for reading a memory cell may involve generating a voltage that depends on the state of the memory cell and then comparing the generated voltage to a reference voltage. The bigger the difference between generated voltages associated with different states of the memory cell (which may in some cases be referred to as a read window or read budget), the greater the accuracy and reliability of the sensing scheme may be. The following disclosure describes methods and apparatuses that may be configured to increase the difference between voltage levels associated with the different states of the memory cell.

In one example, a memory device may couple a memory cell with a first node via a digit line. The voltage of the first node may representative of the logic value (logic state) stored by the memory cell and thus may be at a first value if the memory cell stores a first logic value and may be at a second value if the memory cell stores a second logic value. The first node may in turn be coupled with a second node, where the difference between a voltage of the second node associated with (e.g., when the memory cell stores) the first logic value and a voltage of the second node associated with (e.g., when the memory cell stores) the second logic value is greater than the difference between the corresponding voltages of the first node (e.g., a voltage swing at the second node, which may be considered as the difference between voltages at the second node when the memory cell stores the first logic value versus the second logic value, may be amplified or otherwise increased relative to a voltage swing at the first node).

Upon coupling the first node with the second node, the memory device may selectively couple the second node with a third node—for example, based on whether the voltage at the second node is above or below a threshold level (voltage threshold). For instance, if the voltage of the second node is associated with the first logic value, a transistor—which may be referred to as an arbiter or gatekeeper transistor— may couple the second node with the third node, and the voltage of the third node may change (be adjusted) accordingly. However, if the voltage of the second node is associated with the second logic value, the transistor may not couple the second node with the third node and the voltage of the third node may not change (be adjusted)—for example, the voltage of the third node may instead remain at some other voltage to which the third node was previously biased (e.g., precharged).

By setting (e.g., precharging or otherwise biasing) the third node to an initial voltage and then adjusting the voltage of the third node only if the memory cell stores a first logic value (and leaving the third node at the initial voltage if the memory cell stores a second logic value), the difference between the voltage at the third node associated with the first logic value and the voltage at the third node associated with the second logic value may be increased (e.g., based on setting the initial voltage of the to have a desired difference relative to the adjusted voltage associated with the first logic value), thereby achieving an enlarged read window and voltage swing at the third node relative to the voltage swing at the second node. After a time when the selective coupling would potentially occur, the memory device may compare the voltage at the third node with a reference voltage and may generate, based on the comparing, a signal indicative of the logic value stored by the memory cell.

Features of the disclosure are initially described in the context of memory systems and dies as described with reference to FIGS. 1-2. Features of the disclosure are described in the context of an arbitrated sense circuit and a timing diagram as described with reference to FIGS. 3A and 3B. These and other features of the disclosure are further illustrated by and described with reference to an apparatus diagram and flowcharts that relate to an arbitrated sense amplifier as described with references to FIGS. 4-7.

FIG. 1 illustrates an example of a system 100 that supports an arbitrated sense amplifier in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In one example, a memory device 110 may couple a memory cell to be read with a first node (e.g., by coupling the memory cell with a digit line and the digit line with the first node). After the memory cell is coupled with the first node, the voltage of the first node may come to be at a first value if the memory cell stores a first logic value (is in a first state) and may come to be at a second value if the memory cell contains a second logic value (is in a second state). The memory device 110 may couple the first node with a second node, and the second node may be configured such that the difference between a voltage of the second node when the memory cell stores the first logic value and a voltage of the second node when the memory cell stores the second logic value is greater than the difference between the corresponding voltages of the first node—thus, a voltage swing or read window may be larger (amplified) at the second node relative to at the first node.

The memory device 110 also may selectively couple the second node with a third node, depending on the logic value stored by the memory cell. For example, a transistor may be configured to couple the second node with the third node based on how the voltage at the second node compares to a voltage threshold level (e.g., if the voltage at the second node is below the voltage threshold level). For instance, if the voltage at the second node is associated with the first logic value (e.g., is below the threshold level), the transistor may couple the second node with the third node and may charge or otherwise adjust the voltage of the third node accordingly. However, if the voltage is associated with the second logic value, the transistor may not couple the second node with the third node and the third node may not be charged or otherwise have its voltage adjusted—the third node may instead remain at some other voltage to which the third node may have been previously set. As such, the difference between a voltage at the third node associated with the first logic value and a voltage at the third node associated with the second logic value may be larger than the corresponding voltages at the second node, thereby achieving an enlarged read window at the third node. The memory device 110 may compare the voltage at the third node with a reference voltage and may generate, based on the comparing, a signal indicative of the logic value stored by the memory cell.

Figure 2:
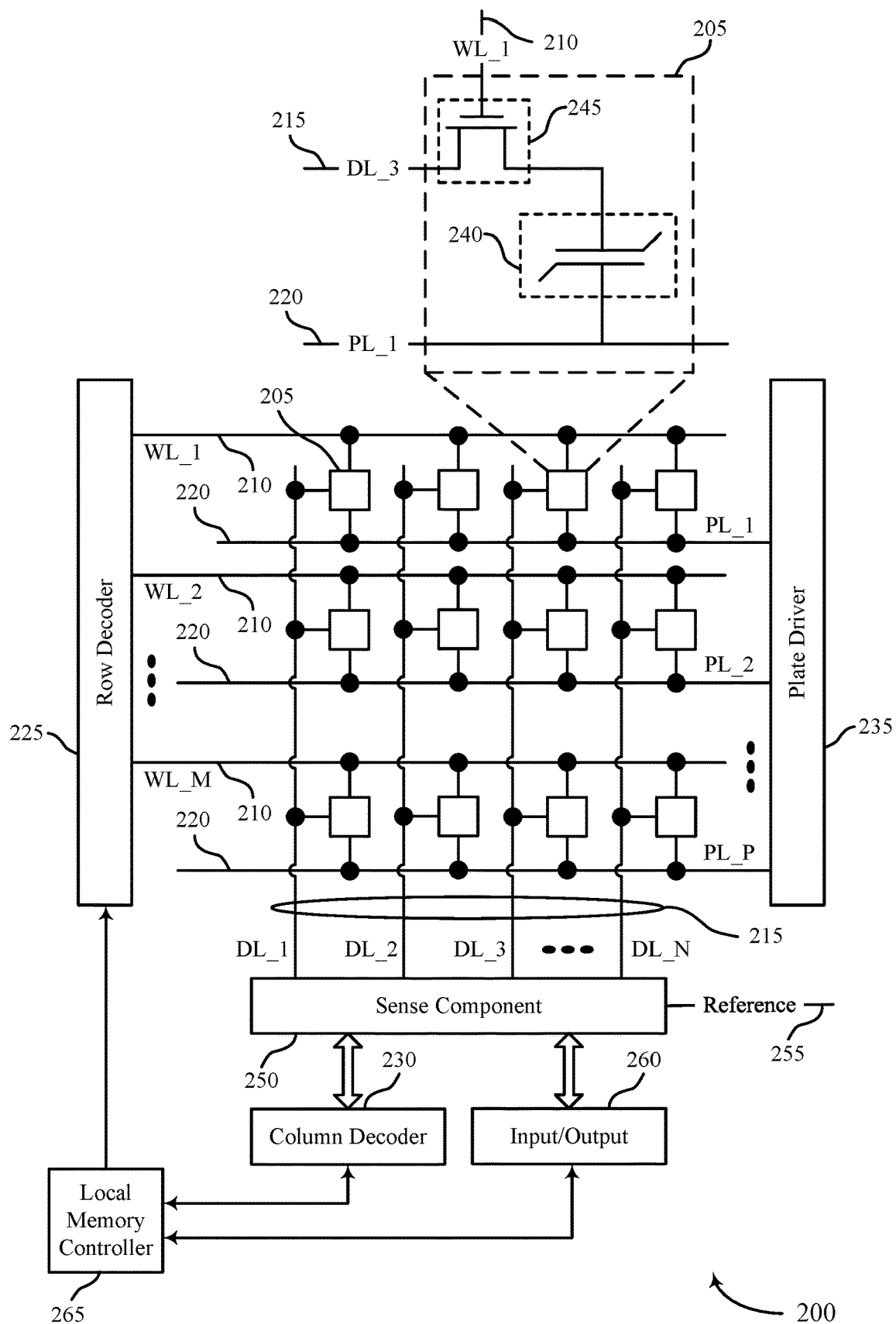
FIG. 2 illustrates an example of a memory die that supports an arbitrated sense amplifier in accordance with examples as disclosed herein.

FIG. 2 illustrates an example of a memory die 200 that supports an arbitrated sense amplifier in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic values (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state or a charge) stored on the capacitor 240 of the memory cell 205 and determine a logic value of the memory cell 205 based on the detected state. The sense component 250 may include one or more components configured to amplify a difference between voltages at a node when the memory cell 205 stores a first logic value versus when the memory cell 205 stores a second logic value (e.g., to increase a read window at the node). Such components may be described in greater details with reference to FIG. 3. The detected logic value of the memory cell 205 may be provided as an output of the sense component 250 (e.g., to an input/output 260), and may indicate the detected logic value to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a read operation (e.g., a sense operation) on one or more memory cells 205 of the memory die 200. During a read operation, the logic value stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205.

The target memory cell 205 may transfer a signal to the sense component 250 in response to biasing the relevant access lines. At a first stage, the sense component 250 may amplify the signal (e.g., may develop amplify a difference between the voltage of the signal when the target memory cell 205 stores a first logic state versus when the target memory cell 205 stores a second logic state). At a second stage, the sense component may selectively pass the amplified signal (and thereby amplify the signal again) based on whether the voltage level of the amplified signal satisfies (e.g., is below) a threshold level. Passing the amplified signal may alter the voltage of a sense node, and not passing the amplified signal may maintain the voltage of the sense node at a prior voltage level. Thus, the second stage of amplification may occur only for a subset (e.g., one) of a set of logic values that may be stored by the target memory cell 205. At a third stage, a voltage of the sense node, which may or may not have been changed from a previously set (configured, biased, precharged) voltage, depending on the voltage level of the amplified signal generated at the first stage, may be compared with the reference 255 (which may be a reference voltage). Based on that comparison, the sense component 250 may determine a logic value that is stored on the memory cell 205.

Figure 3A:
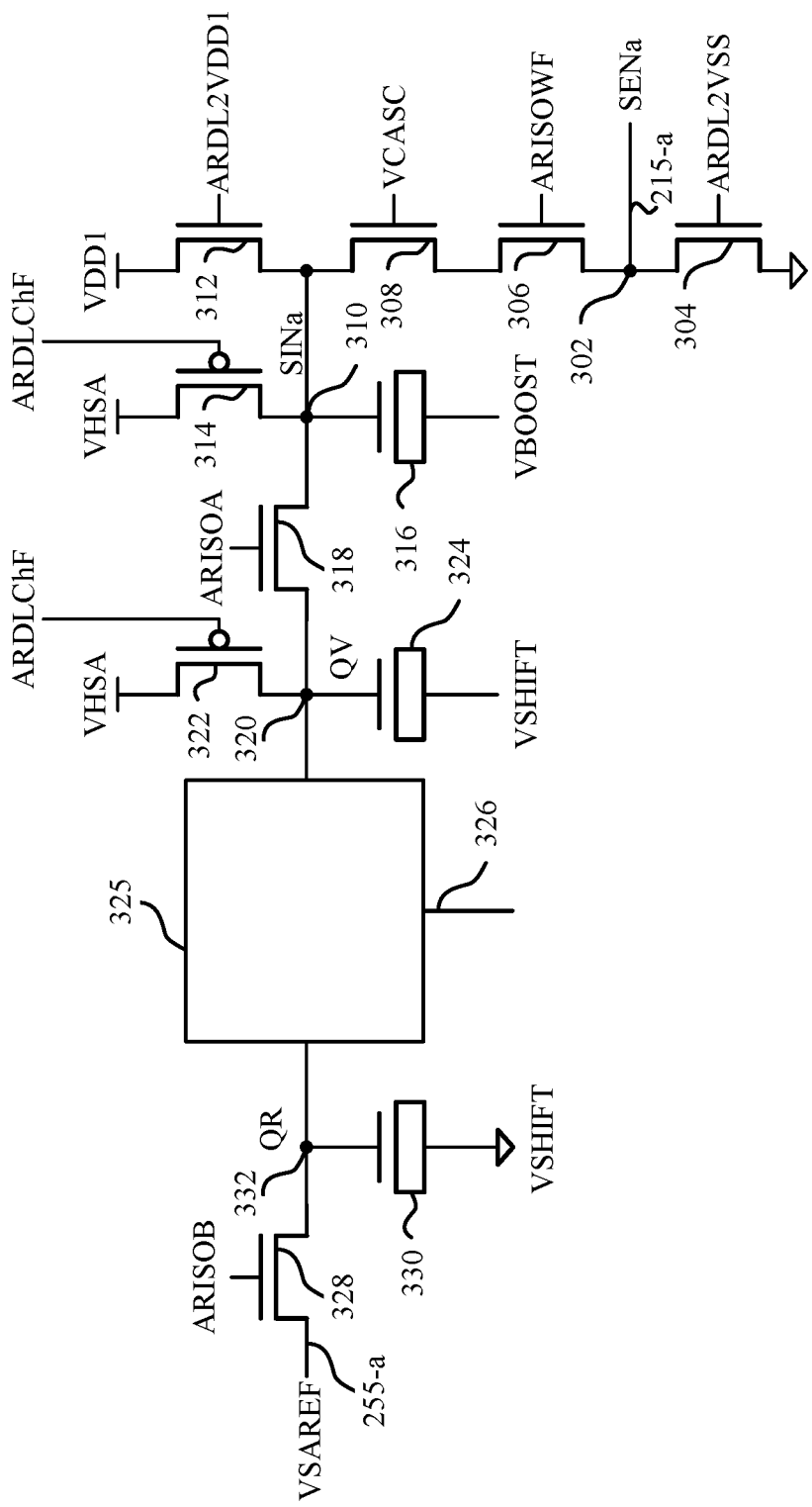
FIG. 3A illustrates an example of a arbitrated sense circuit that supports an arbitrated sense amplifier in accordance with examples as disclosed herein.

FIG. 3A illustrates an example of an arbitrated sense circuit 300-a that supports an arbitrated sense amplifier in accordance with examples as disclosed herein. Arbitrated sense circuit 300-a may be included in or coupled with a sense component 250 as described with reference to FIG. 2. Digit line 215-a may be an example of a digit line 215 as described with reference to FIG. 2.

A digit line 215-a may be selectively couplable with a memory cell 205 to be read, which may be referred to as a target memory cell 205, and which may be operable to store a logic value that is one of a set of two or more logic values, as described with reference to FIG. 2. A SENa node 302 may, in turn, be selectively couplable with the digit line 215-a (e.g., via a transistor (not shown)). The SENa node 302 may be selectively couplable with a ground via ARDL2VSS transistor 304 (e.g., the SENa node 302 may be coupled with the drain of ARDL2VSS transistor 304, and the source of ARDL2VSS transistor 304 may be coupled with the ground). The SENa node 302 may also be selectively couplable with a terminal of cascode transistor 308 via ARISOWF transistor 306 (e.g., the SENa node 302 may be coupled with the source of ARISOWF transistor 306, and the drain of ARISOWF transistor 306 may be coupled with the source of the cascode transistor). The SENa node 302 is labeled SENa in FIG. 3A, but it is to be understood that the SENa node 302 may alternatively be referred to by any other name.

The cascode transistor 308 (e.g., the drain of cascode transistor 308) may be coupled with a SINa node 310. The SINa node 310 may be selectively couplable with a first voltage source via ARDL2VDD1 transistor 312 and may be selectively couplable with a second voltage source via ARDLChF transistor 314. For example, the SINa node 310 may be coupled with a source of ARDL2VDD1 transistor 312 (and the drain of ARDL2VDD1 transistor 312 may be coupled with the first voltage source), and the SINa node 310 may be coupled with a drain of ARDLChF transistor 314 (and the source of ARDLChF transistor 314 may be coupled with the second voltage source, where ARDLChF transistor 314 may in some cases be a PMOS device). The SINa node 310 may also be coupled with a VBOOST capacitor 316. The SINa node 310 may be selectively couplable with a QV node 320 via ARISOa transistor 318. For example, the SINa node 310 may be coupled with the source of ARISOa transistor 318, and the QV node 320 may be coupled with the drain of ARISOa transistor 318, where ARISOa transistor 318 may in some cases be an NMOS device. It is to be understood that ARISOa transistor 318 may in some cases be a PMOS device or include more than one transistor or other switching component. It is also understood that ARISOa transistor 318 may in some examples be replaced by another (e.g., a non-switching component), such as one or more diodes, configured to provide the functionalities ascribed to ARISOa transistor 318 herein. The SINa node 310, first voltage source, and second voltage source are labeled SINa, VDD1, and VHSA respectively in FIG. 3A, but it is to be understood that the SINa node 310, first voltage source, and second voltage source may alternatively be referred to by any other names.

The QV node 320 may be selectively couplable with the second voltage source via ARDLChF transistor 322. (e.g., the QV node 320 may be coupled with the drain of ARDLChF transistor 322, and the source of ARDLChF transistor 322 may be coupled with the second voltage source, where ARDLChF transistor 322 may be a PMOS device). The QV node 320 may also be coupled with a VSHIFT capacitor 324. The QV node 320 may also be coupled with comparison component 325. The QV node 320 is labeled QV in FIG. 3A, but it is to be understood that the QV node 320 may alternatively be referred to by any other name.

Arbitrated sense circuit 300-a may contain a line coupled with a reference 255-a, which may be a reference voltage. The line coupled with the reference 255-a may be selectively couplable to a QR node 332 via ARISOb transistor 328 (e.g., the QR node 332 may be coupled with the drain of ARISOb transistor 328, and the source of ARISOb transistor 328 may be coupled with the reference 255-a). The QR node 332 may be coupled with a VSHIFT capacitor 330 that is coupled with ground. In some cases, the VSHIFT capacitor 330 and the VSHIFT capacitor 324 may have a same capacitance. The QR node 332 may also be coupled with comparison component 325. The QR node 332 is labeled QR in FIG. 3A, but it is to be understood that the QR node 332 may alternatively be referred to by any other name.

Comparison component 325 may be configured to compare the voltage at the QV node 320 with the voltage at the QR node 332. The voltage at the QR node 332 may be equal to or otherwise based on (e.g., offset by the threshold voltage of ARISOb transistor 328) the voltage of the reference 255-a, and thus the voltage at the QR node 332 may likewise be referred to as a reference voltage. Comparison component 325 may generate, based on comparing the voltage at the QV node 320 with the voltage at the QR node 332, an output signal 326 that indicates whether the voltage at the QV node 320 is greater than or less than the voltage at the QR node 332. The output signal 326 thus may indicate a logic state stored by the memory cell 205 coupled with the digit line 215. It is to be understood that the output signal 326 may be single-ended or differential and thus may be carried over any number of output lines coupled with the comparison component 325.

Figure 3B:
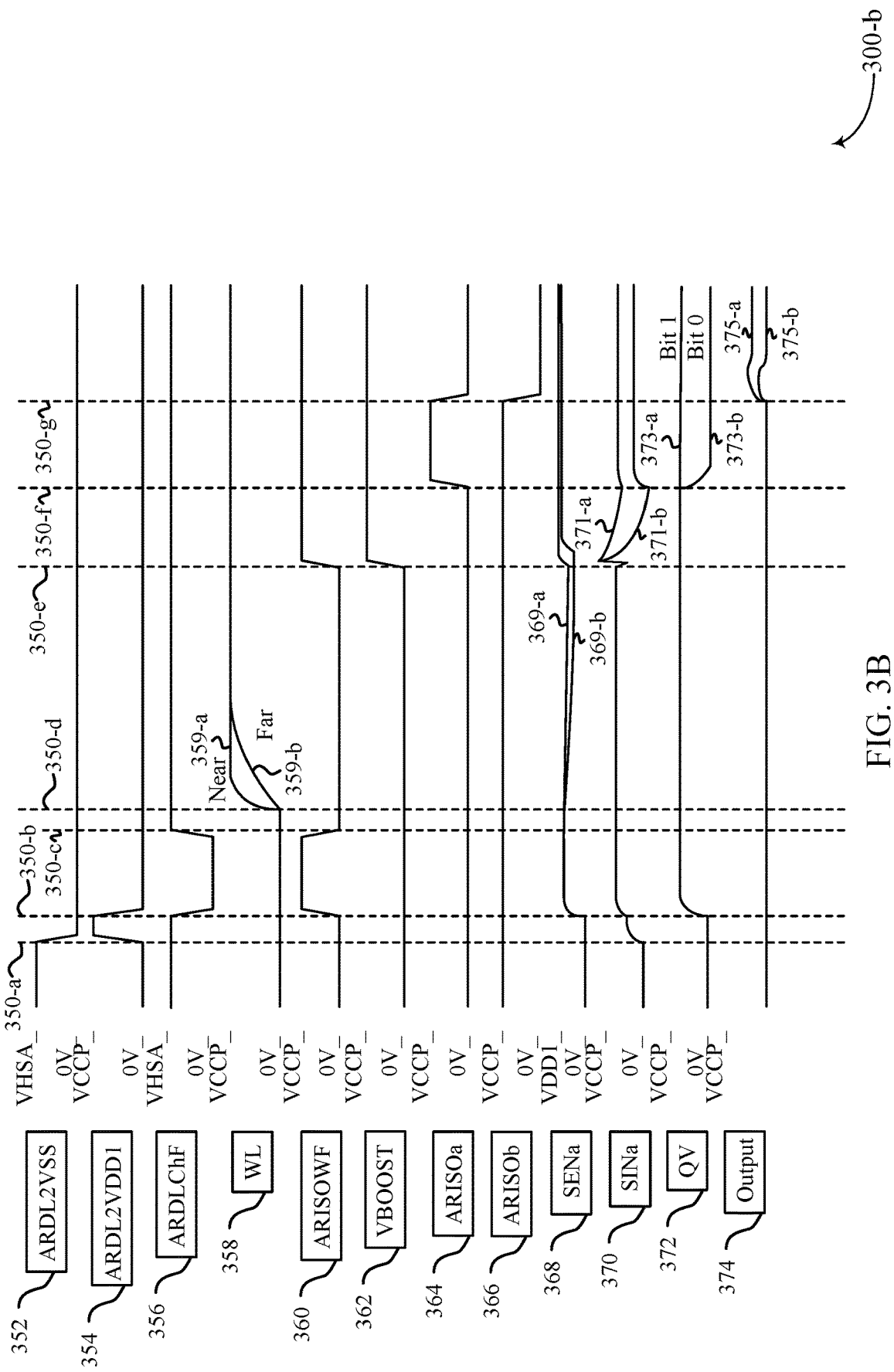
FIG. 3B illustrates an example of a timing diagram that supports an arbitrated sense amplifier in accordance with examples as disclosed herein.

FIG. 3B illustrates an example of a timing diagram 300-b that supports an arbitrated sense amplifier in accordance with examples as disclosed herein. ARDL2VSS signal 352 may be a voltage at a gate of ARDL2VSS transistor 304; ARDL2VDD1 signal 354 may be a voltage at a gate of ARDL2VDD1 transistor 312; ARDLChF signal 356 may be a voltage at a gate of transistors 314 and/or 322; word line signal 358 may be a voltage at a word line coupled with a memory cell that is selectively couplable with digit line 215-a; ARISOWF signal 360 may be a voltage at a gate of ARISOWF transistor 306; VBOOST signal 362 may be a voltage at VBOOST capacitor 316; ARISOa signal 364 may be a voltage at a gate of ARISOa transistor 318; ARISOb signal 366 may be a voltage at a gate of ARISOb transistor 328; SENa signal 368 may be a voltage at the SENa node 302; SINa signal 370 may be a voltage at the SINa node 310; QV signal 372 may be a voltage at the QV node 320; output signal 374 may be a voltage at gates of transistors 336 and 338; signal 376 may be a voltage at a gate of transistor 344; and signal 378 may be a voltage of an output signal 326.

Various names are ascribed to the signals illustrated in FIG. 3B, and these may exist at respective nodes per the corresponding labels in the arbitrated sense circuit 300-a of FIG. 3A. It is to be understood that these names are exemplary only and are not limiting. The signals illustrated in FIG. 3 B that correspond to the gate of a transistor, along with signals to capacitors 316, 324, and 330, may be referred to as control signals.

At an initial time (e.g., before time 350-a), SENa node 302 may be coupled to ground via ARDL2VSS transistor 304, which may be activated due to ARDL2VSS signal 352 being at a high value. The SENa node 302 may be coupled with the digit line 215-a at the initial time (e.g., by a transistor, which may be included in or coupled with a column decoder 230). The SENa node 302 being coupled to ground may discharge (ground, discharge any charge stored in a parasitic capacitance associated with) the digit line 215-a. Additionally, at the initial time, SENa node 302 may be isolated from the SINa node 310, as ARISOWF transistor 306 may be deactivated due to ARISOWF signal 360 being at a low value.

At time 350-a, the ARDL2VSS transistor 304 may be deactivated (e.g., due to ARDL2VSS signal 352 transitioning from a high voltage to a low voltage). Additionally, at or after time 350-a, the ARDL2VDD1 transistor 312, which may be referred to as a first precharge component, may be activated (e.g., due to ARDL2VDD1 signal 354 transitioning from a low voltage to a high voltage, such as VCCP). Activating ARDL2VDD1 transistor 312 may couple the SINa node 310 with a first voltage source which may begin biasing (e.g., precharging) the SINa node 310 to a voltage supplied by the first voltage source, as illustrated in FIG. 3B by the increase in voltage of SINa signal 370 (which may correspond to the voltage of the SINa node 310).

At time 350-b, the ARDL2VDD1 transistor 312 may be deactivated (e.g., due to ARDL2VDD1 signal 354 transitioning from a high voltage to a low voltage). Additionally, at time 350-b, ARDLChF transistor 314, which may be referred to as a second precharge component, may be activated (e.g., due to ARDLChF signal 356 transitioning from a high voltage to a low voltage). Deactivating the ARDL2VDD1 transistor 312 and activating the ARDLChF transistor 314 may couple the SINa node 310 with a second voltage source, which may begin biasing the SINa node 310 to a voltage supplied by the second voltage source, as illustrated in FIG. 3B by the further increase in voltage of SINa signal 370 that begins at time 350-b.

Additionally, at or after time 350-b, the ARISOWF transistor 306 may be activated (e.g., due to ARISOWF signal 360 transitioning from a low voltage to a high voltage). Activating the ARISOWF transistor 306 may couple the SENa node 302 with the SINa node 310. When the SENa node 302 is coupled with the SINa node 310, charge sharing between the SENa node 302 and the SINa node 310 may occur, which may cause SENa signal 368 (which may correspond to the voltage of the SENa node 302) to increase in voltage as shown in FIG. 3B (e.g., to VCCP). As such, the voltage of the SINa node 310 may settle at a voltage (reach a steady state voltage) based on the voltage supplied by the second voltage source, and the SENa node 302 may settle at a voltage (reach a steady state voltage) with a predefined value relative to the SINa node 310 (e.g., the voltage of the SINa node 310 subtracted by the threshold voltage of the cascode transistor 308). Alternatively, in some cases, the ARISOWF transistor 306 may be activated (e.g., due to ARISOWF signal 360 transitioning from the low voltage to the high voltage) at time 350-a, in which case SENa signal 368 may begin increasing in voltage at time 350-a.

Additionally, at time 350-b, ARDLChF transistor 322, which may be referred to as a third precharge component, may be activated (e.g., due to ARDLChF signal 356 transitioning from the high voltage to the low voltage), which may couple the QV node 320 with the second voltage source, which may begin biasing the QV node 320 to a voltage supplied by the second voltage source, as illustrated in FIG. 3B by the increase in voltage of QV signal 372 (which may correspond to the voltage of the QV node 320) that begins at time 350-b. As described herein, the steady state voltage reached by the QV node 320 between time 350-b and time 350-c may be considered (e.g., may be interpreted by the comparison component 325) as corresponding to a first logic value stored at the memory cell of the set of logic values—e.g., as described in more detail elsewhere herein, the QV signal 372 may subsequently change in voltage only if the memory cell stores a second logic value of the set of logic values. Performing the operations at 350-a and 350-b may precharge the SENa node 302, the SINa node 310, and the QV node 320. In some cases, the transistors 312, 314, and 322 may be considered as comprising any number (e.g., three or one) of precharge components.

At 350-c, transistors 314 and 322 may be deactivated (e.g., due to ARDLChF signal 356 transitioning from low voltage to high voltage). ARISOWF transistor 306 may also be deactivated (e.g., due to ARISOWF signal 360 transitioning from high voltage to low voltage) at 350-c (or alternatively before time 350-c, or alternatively after time 350-c but before time 350-d).

After time 350-d, a word line 210 coupled with the target memory cell (e.g., a switching component 245 therein) may be activated, which may couple the target memory cell (e.g., a ferroelectric capacitor 240 therein) with digit line 215-a and thus with the SENa node 302. If the word line 210 is located within a memory array such that the word line 210 is relatively close to a driver supplying voltage to the word line 210, the word line 240 may have a voltage curve as demonstrated by curve 359-a. If the word line 210 is located within the memory array such that the word line 210 is relatively far from the driver, the word line 210 may have a voltage curve as demonstrated by curve 359-b.

If the target memory cell stores the first logic value (e.g., a logic 1), SENa signal 368 may change as according to curve 369-a, and if the target memory cell stores a second logic value (e.g., a logic 0), SENa signal 368 may change as according to curve 369-b. The range or difference between a curve associated with a first logic value (e.g., 369-a) and a curve associated with a second logic value (e.g., curve 369-b) may be referred to as the voltage swing or read window associated with the SENa signal 368 and thus the SENa node 302. The curve that has a higher voltage value of the two curves at a particular instance of time (e.g., curve 369-a between 350-d and 350-e) may be referred to as the upper bound of the voltage swing for that particular instance of time and the curve that has a lower voltage value at a particular instance of time (e.g., curve 369-b between 350-d and 350-e) may be referred to as the lower bound of the voltage swing for that particular instance of time.

At time 350-e the ARISOWF transistor 306, which may also be referred to as a signal development component, may be activated (e.g., ARISOWF signal 360 may transition from a low voltage to a high voltage, such as VCCP). Activating ARISOWF transistor 306 may couple the SENa node 302 with the SINa node 310 and may enable charge sharing to occur between them. Due to a capacitance of the SENa node 302, which may include the capacitance of digit line 215-a, being larger than the capacitance of the SINa node 310, a voltage swing between curves 371-a and 371-b may be larger in magnitude than the voltage swing between curves 369-a and 369-b.

Additionally, at or after time 350-e, VBOOST capacitor 316 may have a VBOOST signal 362 (e.g., a control signal) applied to one of its terminals. Applying the VBOOST signal 362 in this manner may boost the absolute voltage level of the SINa node 310 as shown by the increase in SINa signal 370 after time 350-e, which may support the development of a larger read window at the SINa node 310, among other benefits that may be appreciated by one of ordinary skill in the art. It should be noted that, in some examples, the VBOOST capacitor 316 may not be included in the arbitrated sense circuit 300-a and/or the VBOOST signal 362 may not be applied to the VBOOST capacitor 316 (e.g., the node of the VBOOST capacitor 316 coupled with the VBOOST signal 362 may instead be grounded). The combination of ARISOWF transistor 306 and cascode transistor 308 may be referred to as a first gain component. Further, charge sharing between the SENa node 302 and the SINa node 310 at or after time 350-e, which may in some cases occur via ARISOWF transistor 306 and cascode transistor 308, may be a first stage of amplification or gain, due to the difference in voltage swing between SINa signal 370 and SENa signal 368.

At time 350-f, ARISOa transistor 318, which may be referred to as an arbiter or gatekeeping component, and which may additionally or alternatively be referred to as a coupling component or a second gain component, may be selectively activated or deactivated based on the voltage of the SINa node 310 (of SINa signal 370) at time 350-f and based on the voltage of ARISOa signal 364, which may be applied to the gate of ARISOa transistor 318. For instance, at time 350-f, ARISOa signal 364 may transition from a low voltage (low state) to a high voltage (e.g., high state, VCCP).

If SINa signal 370 at time 350-f is at a voltage associated with the first logic value (e.g., at an upper bound of the voltage swing, such as following curve 371-a or otherwise above a voltage threshold), ARISOa transistor 318 may not be activated (may remain deactivated) or may otherwise isolate the SINa node 310 from the QV node 320 (e.g., due to a voltage differential between ARISOa signal 364 and SINa signal 370 being too low, such as lower than a threshold voltage of ARISOa transistor 318; due to the voltage of SINa signal 370 being greater than or equal to a voltage threshold level). In such cases, the voltage of the QV node 320 (QV signal 372) may remain the same after time 350-f as before time 350-f (e.g., as shown in curve 373-a).

If, however, SINa signal 370 at time 350-f is at a voltage associated with the second logic value (e.g., at a lower bound of the voltage swing, such as following curve 371-b or otherwise below the voltage threshold), ARISOa transistor 318 may be activated (e.g., due to a voltage differential between ARISOa signal 364 and SINa signal 370 being sufficiently high, such as greater than a threshold voltage of ARISOa transistor 318; due to the voltage of SINa signal 370 being below the voltage threshold level). In such cases, the voltage of the QV node 320 may begin to change at time 350-f according to SENa signal 368 (e.g., as demonstrated curve 373-b). In some cases, the voltage swing between curves 373-a and 373-b at time 350-g may be larger than the voltage swing between curves 371-a and 371-b at time 350-g. In some cases, where the ARISOa transistor 318 is activated, charge sharing may occur between the QV node 320 and the SINa node 310 after (e.g., beginning at) time 350-f, and the difference between the voltage swing between curves 373-a and 373-b and the voltage swing between curves 371-a and 371-b may be based on a capacitance of QV node 320 being smaller than a capacitance of SINa node 310. In some cases, charge sharing between the QV node 320 and the SINa node 310, which may occur via ARISOa transistor 318, may be a second stage of amplification or gain, due to the difference in voltage swing between QV signal 372 and SINa signal 370. The second stage of amplification may be arbitrated and selectively occur if the target memory cell 205 stores the second logic value, but not the first logic value.

The level to which ARISOa signal 364 is adjusted (that is, the upper bound of ARISOa signal 364) may be configurable (e.g., as a trim parameter; based on a fuse setting). In some cases, the upper bound of ARISOa signal 364 may be dynamically configured (adjusted) (e.g., by a memory controller, such as local memory controller 265), based on a temperature of a memory device or other system that includes sense circuit 300-a. For instance, if the temperature of a device containing sense circuit 300-a (e.g., a memory device 110) is above a threshold temperature, the ARISOa signal 364 may be adjusted to a higher or lower level as compared to a device below or at the threshold temperature. The gate of ARISOa transistor 318 may thus be operable to be biased between time 350-a and time 350-g at a bias voltage that is greater than a lower bound of the voltage swing at the SINa node 310 (e.g., greater than a minimum point of curve 371-b between 350-f and 350-g) by an amount greater than or equal to the threshold voltage of ARISOa transistor 318, such that ARISOa transistor 318 may be come activated when the voltage at the SINa node 310 is associated with curve 371-b and thus the second logic state. Additionally or alternatively, the gate of ARISOa transistor 318 may be operable to be biased between time 350-a and time 350-g at a bias voltage that is less than a sum of the upper bound of the voltage swing at the SINa node 310 (e.g., greater than a maximum point of curve 371-a between 350-f and 350-g) and the threshold voltage of ARISOa transistor 318, such that ARISOa transistor 318 may remain deactivated when the voltage at the SINa node 310 is associated with curve 371-a and thus the first logic state. Although the present example refers to a ARISOa transistor 318 that is illustrated as an NMOS device, it should be noted that a diode may be substituted for the ARISOa transistor 318 without deviating from the scope of the present disclosure. Additionally or alternatively, the ARISOa transistor 318 may be substituted for a PMOS device, or for any number and combination of types of transistors or other switching components.

In some cases, at or after 350-f, a voltage at VSHIFT capacitor 324 and VSHIFT capacitor 330 (e.g., a control signal applied to a second node of VSHIFT capacitor 324 (where a first node of VSHIFT capacitor 324 is coupled with the QV node 320) and also applied to a second node of VSHIFT capacitor 330 (where a first node of VSHIFT capacitor 330 is coupled with the QR node 332) may shift which may shift signal 372 at the QV node 320 up or down. For example, the voltage at VSHIFT capacitor 324 and VSHIFT capacitor 330—labeled as VSHIFT in FIG. 3A—may shift down, which may reduce the absolute voltages at the QV node 320 and the QR node 332, which may support the use of lower voltage tolerance components within the comparison component 325, among other benefits that may be appreciated by one of ordinary skill in the art. In some examples, the capacitors 324 and 330 may not be included in the arbitrated sense circuit 300-a and/or the voltage applied to the second node of VSHIFT capacitor 324 and the second node of VSHIFT capacitor 330 may not shift (e.g., the second node of VSHIFT capacitor 324 and the second node of VSHIFT capacitor 330 may instead be grounded).

At time 350-g, transistors 318 and 328 may be deactivated (e.g., ARISOa signal 364 and ARISOb signal 366 may transition from high to low). The voltage at QR node 332 may be at a value equal to or otherwise based on the voltage of reference 255-a, which may be based on the QR node 332 having been previously coupled with reference 255-a. The voltage at the QR node 332 at time 305-f may have a value in between the voltage of signal 372 at time 350-g when associated with a first logic value (e.g., following curve 373-a) and the voltage of signal 372 at time 350-g when associated with a second logic value (e.g., following curve 373-b). In some cases, VSHIFT capacitor 330 may be operable to be adjusted based on a voltage or control signal being applied to one of its terminals. The voltage or control signal applied to the terminal of VSHIFT capacitor 330 may be the same as the voltage or control signal applied to the terminal of VSHIFT capacitor 324.

At time 350-g, the comparison component 325 may generate at output 326 an output signal 374 indicative of the logic value stored at the at the memory cell based on comparing the voltage at the QV node 320 with the reference voltage at the QR node 332 as of time 350-g. Thus, the difference between curve 373-a and 373-b as of time 350-g may correspond to a read window at the QV node 320 and thus of the sense circuit 300-a. If the signal 372 at QV node 320 at time 350-g is associated with the first logic value (e.g., following curve 373-a), then the first output 326 may output an output signal 374 following curve 375-a. If the signal 372 at QV node 320 at time 350-g is associated with the second logic value (e.g., following curve 373-b), then the first output 326 may output an output signal 374 following curve 375-b.

Figure 4:
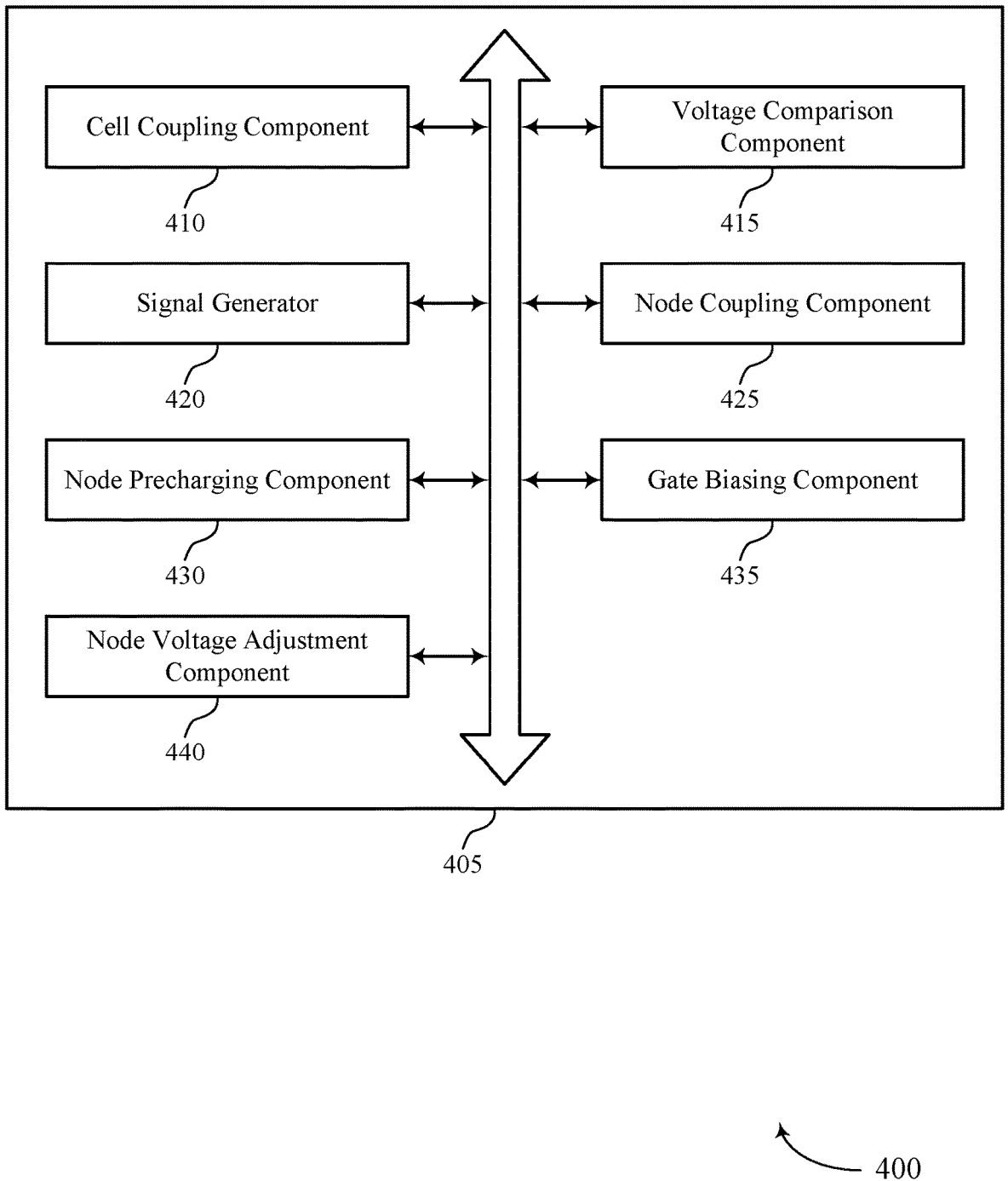
FIG. 4 shows a block diagram of a memory device that supports an arbitrated sense amplifier in accordance with examples as disclosed herein.

FIG. 4 shows a block diagram 400 of a memory device 405 that supports an arbitrated sense amplifier in accordance with examples as disclosed herein. The memory device 405 may be an example of aspects of a memory device as described with reference to FIGS. 1 through 3. The memory device 405 may include a cell coupling component 410, a voltage comparison component 415, a signal generator 420, a node coupling component 425, a node precharging component 430, a gate biasing component 435, and a node voltage adjustment component 440. Each of these modules may communicate, directly or indirectly, with one another (e.g., via one or more buses).

The cell coupling component 410 may couple a memory cell with a first node, where a voltage at the first node is based on the memory cell being coupled with the first node and a logic value stored by the memory cell.

The node coupling component 425 may couple, after the memory cell is coupled with the first node, the first node with a second node, where a voltage at the second node is based on the first node being coupled with the second node and the voltage at the first node. In some examples, the node coupling component 425 may couple, after the first node is coupled with the second node, the second node with a third node based on the voltage at the second node and a voltage threshold.

The voltage comparison component 415 may compare, after the third node is coupled with the second node, a voltage at the third node with a reference voltage.

The signal generator 420 may generate, based on the comparing, a signal indicative of the logic value stored by the memory cell.

In some examples, the node coupling component 425 may couple the second node with the third node based on the voltage at the second node being below the voltage threshold. In some examples, the node coupling component 425 may decouple the third node from the second node before the comparing. In some cases, after the first node is coupled with the second node, the voltage at the second node is based at least in part on a first capacitance associated with the first node, a second capacitance associated with the second node, and charge sharing between the first node and the second node. In some cases, after the second node is coupled with the third node, the voltage at the second node is based at least in part on a first capacitance associated with the second node, a second capacitance associated with the third node, and charge sharing between the second node and the third node.

The node precharging component 430 may precharge, before the first node is coupled with the second node, the third node to a voltage associated with a first logic value. In some cases, the voltage at the third node changes to a second voltage associated with the second logic value based on the second node being coupled with the third node.

The gate biasing component 435 may bias a gate of a transistor at a bias voltage, where the second node is coupled with the third node via the transistor based on a differential between the bias voltage and the second voltage satisfying the voltage threshold. In some examples, the gate biasing component 435 may adjust a voltage of the gate of the transistor to the bias voltage after the first node is coupled with the second node. In some examples, the gate biasing component 435 may adjust the bias voltage based on a temperature of a device that includes the memory cell. In some cases, the transistor is operable to isolate the third node from the second node if the differential between the bias voltage and the second voltage is below the voltage threshold. In some cases, the bias voltage is based on a configurable parameter.

The node voltage adjustment component 440 may adjust the voltage of the second node before coupling the second node with the third node.

Figure 5:
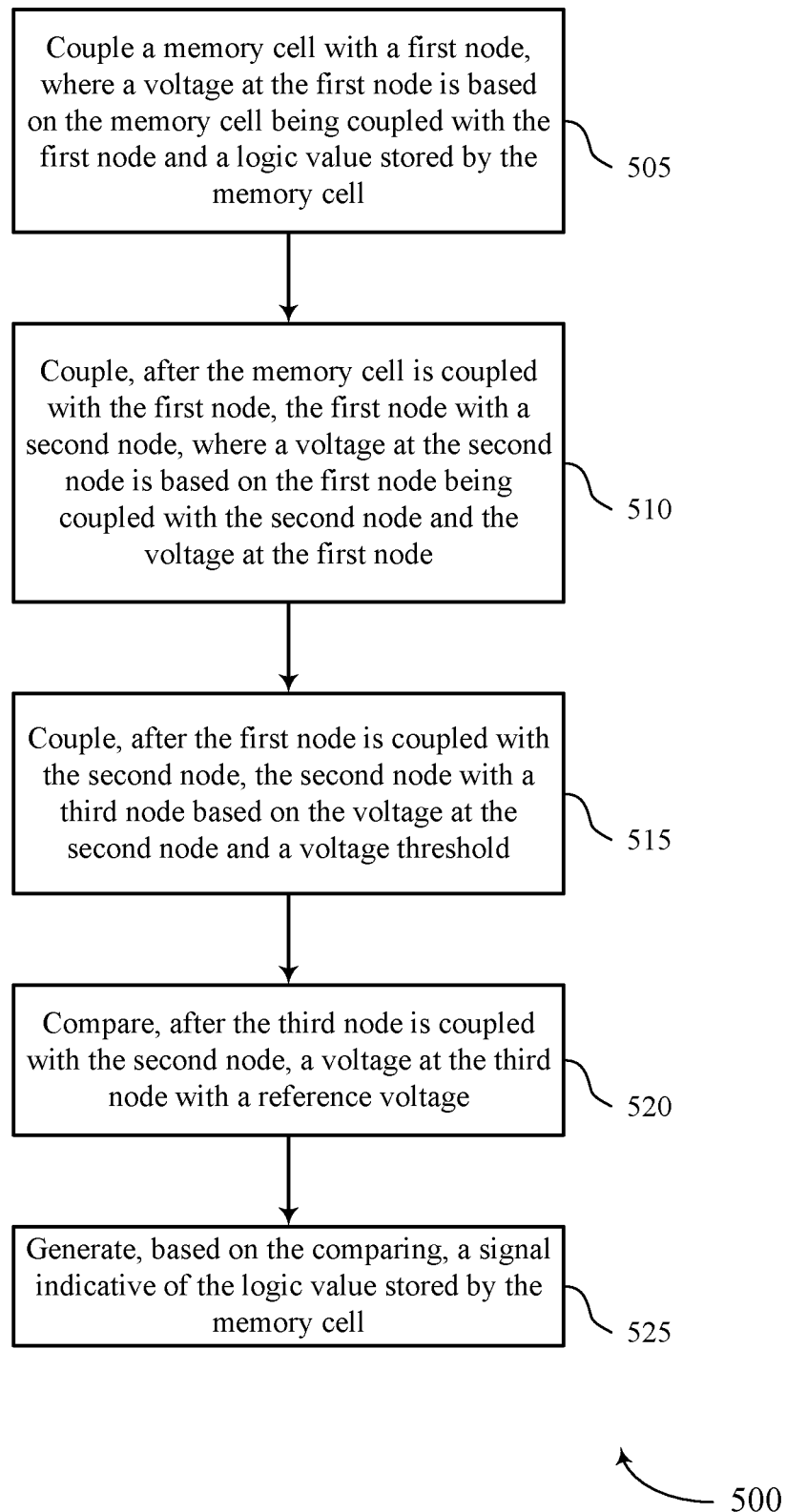
FIGS. 5 through 7 show flowcharts illustrating a method or methods that support an arbitrated sense amplifier in accordance with examples as disclosed herein.

FIG. 5 shows a flowchart illustrating a method or methods 500 that supports an arbitrated sense amplifier in accordance with examples as disclosed herein. The operations of method 500 may be implemented by a memory device or its components as described herein. For example, the operations of method 500 may be performed by a memory device as described with reference to FIG. 4. In some examples, a memory device may execute a set of instructions to control the functional elements of the memory device to perform the described functions. Additionally or alternatively, a memory device may perform aspects of the described functions using special-purpose hardware.

At 505, the memory device may couple a memory cell with a first node, where a voltage at the first node is based on the memory cell being coupled with the first node and a logic value stored by the memory cell. The operations of 505 may be performed according to the methods described herein. In some examples, aspects of the operations of 505 may be performed by a cell coupling component as described with reference to FIG. 4.

At 510, the memory device may couple, after the memory cell is coupled with the first node, the first node with a second node, where a voltage at the second node is based on the first node being coupled with the second node and the voltage at the first node. The operations of 510 may be performed according to the methods described herein. In some examples, aspects of the operations of 510 may be performed by a node coupling component as described with reference to FIG. 4.

At 515, the memory device may couple, after the first node is coupled with the second node, the second node with a third node based on the voltage at the second node and a voltage threshold. The operations of 515 may be performed according to the methods described herein. In some examples, aspects of the operations of 515 may be performed by a node coupling component as described with reference to FIG. 4.

At 520, the memory device may compare, after the third node is coupled with the second node, a voltage at the third node with a reference voltage. The operations of 520 may be performed according to the methods described herein. In some examples, aspects of the operations of 520 may be performed by a voltage comparison component as described with reference to FIG. 4.

At 525, the memory device may generate, based on the comparing, a signal indicative of the logic value stored by the memory cell. The operations of 525 may be performed according to the methods described herein. In some examples, aspects of the operations of 525 may be performed by a signal generator as described with reference to FIG. 4.

In some examples, an apparatus as described herein may perform a method or methods, such as the method 500. The apparatus may include features, means, or instructions (e.g., a non-transitory computer-readable medium storing instructions executable by a processor) for coupling a memory cell with a first node, where a voltage at the first node is based on the memory cell being coupled with the first node and a logic value stored by the memory cell, coupling, after the memory cell is coupled with the first node, the first node with a second node, where a voltage at the second node is based on the first node being coupled with the second node and the voltage at the first node, coupling, after the first node is coupled with the second node, the second node with a third node based on the voltage at the second node and a voltage threshold, comparing, after the third node is coupled with the second node, a voltage at the third node with a reference voltage, and generating, based on the comparing, a signal indicative of the logic value stored by the memory cell.

In some examples of the method 500 and the apparatus described herein, coupling the second node with the third node may include operations, features, means, or instructions for coupling the second node with the third node based on the voltage at the second node being below the voltage threshold.

Some examples of the method 500 and the apparatus described herein may further include operations, features, means, or instructions for decoupling the third node from the second node before the comparing.

In some examples of the method 500 and the apparatus described herein, the logic value stored by the memory cell may be a second logic value, and the method 500 and the apparatus may include operations, features, means, or instructions for precharging, before the first node may be coupled with the second node, the third node to a voltage associated with a first logic value.

In some examples of the method 500 and the apparatus described herein, the voltage at the third node changes to a second voltage associated with the second logic value based on the second node being coupled with the third node.

Some examples of the method 500 and the apparatus described herein may further include operations, features, means, or instructions for biasing a gate of a transistor at a bias voltage, where the second node may be coupled with the third node via the transistor based on a differential between the bias voltage and the voltage at the second node satisfying the voltage threshold.

In some examples of the method 500 and the apparatus described herein, the transistor may be operable to isolate the third node from the second node if the differential between the bias voltage and the voltage at the second node may be below the voltage threshold.

In some examples of the method 500 and the apparatus described herein, biasing the gate of the transistor to the bias voltage may include operations, features, means, or instructions for adjusting a voltage of the gate of the transistor to the bias voltage after the first node may be coupled with the second node.

In some examples of the method 500 and the apparatus described herein, the bias voltage may be based on a configurable parameter.

Some examples of the method 500 and the apparatus described herein may further include operations, features, means, or instructions for adjusting the bias voltage based on a temperature of a device that includes the memory cell.

In some examples of the method 500 and the apparatus described herein, after the first node may be coupled with the second node, the voltage at the second node may be based on a first capacitance associated with the first node, a second capacitance associated with the second node, and charge sharing between the first node and the second node.

In some examples of the method 500 and the apparatus described herein, after the second node may be coupled with the third node, the voltage at the second node may be based on the second capacitance associated with the second node, a third capacitance associated with the third node, and charge sharing between the second node and the third node.

Some examples of the method 500 and the apparatus described herein may further include operations, features, means, or instructions for adjusting the voltage at the second node before coupling the second node with the third node.

Figure 6:
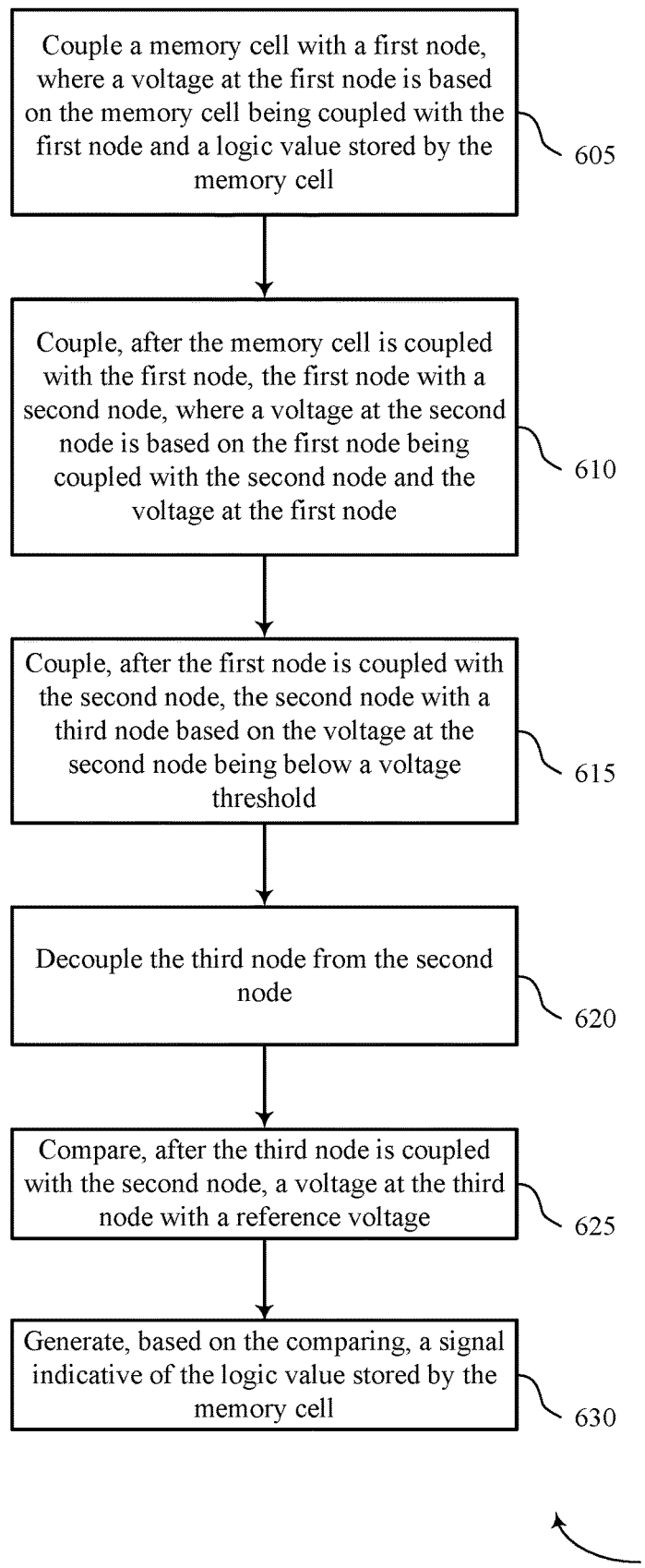

FIG. 6 shows a flowchart illustrating a method or methods 600 that supports an arbitrated sense amplifier in accordance with examples as disclosed herein. The operations of method 600 may be implemented by a memory device or its components as described herein. For example, the operations of method 600 may be performed by a memory device as described with reference to FIG. 4. In some examples, a memory device may execute a set of instructions to control the functional elements of the memory device to perform the described functions. Additionally or alternatively, a memory device may perform aspects of the described functions using special-purpose hardware.

At 605, the memory device may couple a memory cell with a first node, where a voltage at the first node is based on the memory cell being coupled with the first node and a logic value stored by the memory cell. The operations of 605 may be performed according to the methods described herein. In some examples, aspects of the operations of 605 may be performed by a cell coupling component as described with reference to FIG. 4.

At 610, the memory device may couple, after the memory cell is coupled with the first node, the first node with a second node, where a voltage at the second node is based on the first node being coupled with the second node and the voltage at the first node. The operations of 610 may be performed according to the methods described herein. In some examples, aspects of the operations of 610 may be performed by a node coupling component as described with reference to FIG. 4.

At 615, the memory device may couple, after the first node is coupled with the second node, the second node with a third node based on the voltage at the second node being below a voltage threshold. The operations of 615 may be performed according to the methods described herein. In some examples, aspects of the operations of 615 may be performed by a node coupling component as described with reference to FIG. 4.

At 620, the memory device may decouple the third node from the second node. The operations of 620 may be performed according to the methods described herein. In some examples, aspects of the operations of 620 may be performed by a node coupling component as described with reference to FIG. 4.

At 625, the memory device may compare, after the third node is coupled with the second node, a voltage at the third node with a reference voltage. The operations of 625 may be performed according to the methods described herein. In some examples, aspects of the operations of 625 may be performed by a voltage comparison component as described with reference to FIG. 4.

At 630, the memory device may generate, based on the comparing, a signal indicative of the logic value stored by the memory cell. The operations of 630 may be performed according to the methods described herein. In some examples, aspects of the operations of 630 may be performed by a signal generator as described with reference to FIG. 4.

Figure 7:
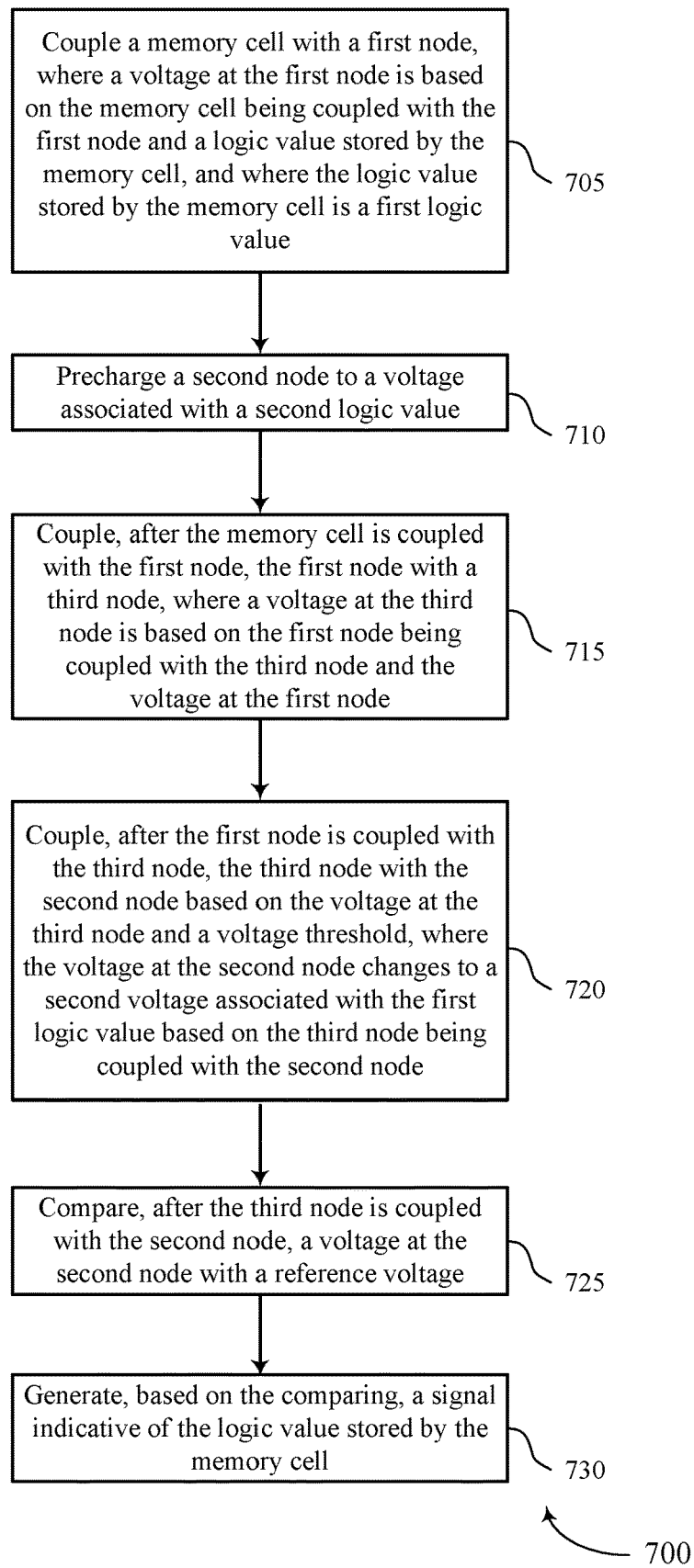

FIG. 7 shows a flowchart illustrating a method or methods 700 that supports an arbitrated sense amplifier in accordance with examples as disclosed herein. The operations of method 700 may be implemented by a memory device or its components as described herein. For example, the operations of method 700 may be performed by a memory device as described with reference to FIG. 4. In some examples, a memory device may execute a set of instructions to control the functional elements of the memory device to perform the described functions. Additionally or alternatively, a memory device may perform aspects of the described functions using special-purpose hardware.

At 705, the memory device may couple a memory cell with a first node, where a voltage at the first node is based on the memory cell being coupled with the first node and a logic value stored by the memory cell, and where the logic value stored by the memory cell is a first logic value. The operations of 705 may be performed according to the methods described herein. In some examples, aspects of the operations of 705 may be performed by a cell coupling component as described with reference to FIG. 4.

At 710, the memory device may precharge a second node to a voltage associated with a second logic value. The operations of 710 may be performed according to the methods described herein. In some examples, aspects of the operations of 710 may be performed by a node precharging component as described with reference to FIG. 4.

At 715, the memory device may couple, after the memory cell is coupled with the first node, the first node with a third node, where a voltage at the third node is based on the first node being coupled with the third node and the voltage at the first node. The operations of 715 may be performed according to the methods described herein. In some examples, aspects of the operations of 715 may be performed by a node coupling component as described with reference to FIG. 4.

At 720, the memory device may couple, after the first node is coupled with the third node, the third node with the second node based on the voltage at the third node and a voltage threshold, where the voltage at the second node changes to a second voltage associated with the first logic value based on the third node being coupled with the second node. The operations of 720 may be performed according to the methods described herein. In some examples, aspects of the operations of 720 may be performed by a node coupling component as described with reference to FIG. 4.

At 725, the memory device may compare, after the third node is coupled with the second node, a voltage at the second node with a reference voltage. The operations of 725 may be performed according to the methods described herein. In some examples, aspects of the operations of 725 may be performed by a voltage comparison component as described with reference to FIG. 4.

At 730, the memory device may generate, based on the comparing, a signal indicative of the logic value stored by the memory cell. The operations of 730 may be performed according to the methods described herein. In some examples, aspects of the operations of 6730 may be performed by a signal generator as described with reference to FIG. 4.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory cell operable to store a logic value that is one of a set of at least two logic values, a first node operable to be selectively coupled with the memory cell, where a voltage of the first node when coupled with the memory cell is based on the logic value and is associated with a first voltage swing, a signal development component operable to selectively couple a second node with the first node, where a voltage of the second node when coupled with the first node is based on the voltage of the first node and is associated with a second voltage swing that is greater than the first voltage swing, a coupling component operable to selectively couple a third node with the second node based on whether the voltage of the second node is below a voltage threshold, and a comparison component operable to generate a signal indicative of the logic value based on a comparison of a voltage at the third node with a reference voltage.

In some examples, the coupling component may be operable to couple the third node with the second node when the voltage of the second node may be below the voltage threshold and to isolate the third node from the second node when the voltage of the second node may be greater than or equal to the voltage threshold.

In some examples, the coupling component includes a transistor with a gate operable to be biased at a bias voltage that is greater than a lower bound of the second voltage swing by an amount greater than or equal to a threshold voltage of the transistor and less than a sum of the upper bound of the second voltage swing and the threshold voltage of the transistor.

In some examples, the coupling component may be operable to couple the third node with the second node when the voltage of the second node may be at a first bound of the second voltage swing and to isolate the third node from the second node when the voltage of the second node may be at a second bound of the second voltage swing.

Some examples of the apparatus may include a precharge component operable to adjust the voltage of the third node to a first voltage corresponding to a first logic value of the set, where the coupling component may be operable to adjust the voltage of the third node towards a second voltage when the third node may be coupled with the second node, the second voltage corresponding to a second logic value of the set.

In some examples, the voltage of the third node may be associated with a third voltage swing that may be greater than the second voltage swing, and a difference between the third voltage swing and the second voltage swing may be based on a first capacitance associated with the second node and a second capacitance associated with the third node, the second capacitance smaller than the first capacitance.

In some examples, a difference between the second voltage swing and the first voltage swing may be based on a first capacitance associated with the first node and a second capacitance associated with the second node, the second capacitance smaller than the first capacitance.

Some examples of the apparatus may include a capacitor coupled with the second node and a control signal, and where the voltage of the second node may be operable to be adjusted based on the control signal.

Some examples of the apparatus may include a second capacitor coupled with the third node and a second control signal, and where the voltage of the third node may be operable to be adjusted based on the second control signal, and a third capacitor coupled with a reference node and the second control signal, where the voltage of third node is operable to be adjusted based on the second control signal.

In some examples, the memory cell includes a ferroelectric capacitor.

An apparatus is described. The apparatus may include a first gain component coupled with a first node and a second node, where the first node is operable to be coupled with a memory cell, and where the first gain component is operable to adjust a voltage of the second node based on a voltage of the first node, a precharge component operable to set a voltage of a third node to a first voltage, and a second gain component coupled with the second node and the third node and operable to adjust the voltage of the third node to a second voltage when the voltage of the second node is below a voltage threshold, maintain the voltage of the third node at the first voltage when the voltage of the second node is greater than or equal to the voltage threshold, and a comparison component operable to indicate a logic value associated with the memory cell based on a comparison of the voltage of the third node to a reference voltage, where the reference voltage is between the first voltage and the second voltage.

In some examples, the second gain component may include operations, features, means, or instructions for a transistor operable to selectively couple the second node with the third node based on a difference between the voltage of the second node and a voltage of a gate of the transistor.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of the memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:
1. An apparatus, comprising:
a memory cell operable to store a logic value that is one of a set of at least two logic values;

a first node operable to be selectively coupled with the memory cell, wherein a voltage of the first node when coupled with the memory cell is based at least in part on the logic value and is associated with a first voltage swing;

a signal development component operable to selectively couple a second node with the first node, wherein a voltage of the second node when coupled with the first node is based at least in part on the voltage of the first node and is associated with a second voltage swing that is greater than the first voltage swing, wherein a difference between the second voltage swing and the first voltage swing is based at least in part on a first capacitance associated with the first node and a second capacitance associated with the second node, the second capacitance smaller than the first capacitance;

a coupling component operable to selectively couple a third node with the second node based at least in part on whether the voltage of the second node is below a voltage threshold; and a comparison component operable to generate a signal indicative of the logic value based at least in part on a comparison of a voltage at the third node with a reference voltage.

2. The apparatus of claim 1, wherein the coupling component is operable to couple the third node with the second node when the voltage of the second node is below the voltage threshold and to isolate the third node from the second node when the voltage of the second node is greater than or equal to the voltage threshold.

3. The apparatus of claim 1, wherein the coupling component is operable to couple the third node with the second node when the voltage of the second node is at a first bound of the second voltage swing and to isolate the third node from the second node when the voltage of the second node is at a second bound of the second voltage swing.

4. The apparatus of claim 1, further comprising:
a precharge component operable to adjust the voltage of the third node to a first voltage corresponding to a first logic value of the set, wherein the coupling component is operable to adjust the voltage of the third node towards a second voltage when the third node is coupled with the second node, the second voltage corresponding to a second logic value of the set.

5. The apparatus of claim 1, wherein the memory cell comprises a ferroelectric capacitor.

6. An apparatus, comprising:
a memory cell operable to store a logic value that is one of a set of at least two logic values;
a first node operable to be selectively coupled with the memory cell; wherein a voltage of the first node when coupled with the memory cell is based at least in part on the logic value and is associated with a first voltage swing;
a signal development component operable to selectively couple a second node with the first node, wherein a voltage of the second node when coupled with the first node is based at least in part on the voltage of the first node and is associated with a second voltage swing that is greater than the first voltage swing;
a coupling component operable to selectively couple a third node with the second node based at least in part on whether the voltage of the second node is below a voltage threshold, wherein the coupling component comprises a transistor with a gate operable to be biased at a bias voltage that is greater than a lower bound of the second voltage swing by an amount greater than or equal to a threshold voltage of the transistor and less than a sum of an upper bound of the second voltage swing and the threshold voltage of the transistor; and
a comparison component operable to generate a signal indicative of the logic value based at least in part on a comparison of a voltage at the third node with a reference voltage.

7. An apparatus, comprising:
a memory cell operable to store a logic value that is one of a set of at least two logic values;
a first node operable to be selectively coupled with the memory cell, wherein a voltage of the first node when coupled with the memory cell is based at least in part on the logic value and is associated with a first voltage swing;
a signal development component operable to selectively couple a second node with the first node, wherein a voltage of the second node when coupled with the first node is based at least in part on the voltage of the first node and is associated with a second voltage swing that is greater than the first voltage swing;
a coupling component operable to selectively couple a third node with the second node based at least in part on whether the voltage of the second node is below a voltage threshold; and
a comparison component operable to generate a signal indicative of the logic value based at least in part on a comparison of a voltage at the third node with a reference voltage, wherein the voltage of the third node is associated with a third voltage swing that is greater than the second voltage swing and a difference between the third voltage swing and the second voltage swing is based at least in part on a first capacitance associated with the second node and a second capacitance associated with the third node, the second capacitance smaller than the first capacitance.

8. An apparatus, comprising:
a memory cell operable to store a logic value that is one of a set of at least two logic values;
a first node operable to be selectively coupled with the memory cell, wherein a voltage of the first node when coupled with the memory cell is based at least in part on the logic value and is associated with a first voltage swing;
a signal development component operable to selectively couple a second node with the first node, wherein a voltage of the second node when coupled with the first node is based at least in part on the voltage of the first node and is associated with a second voltage swing that is greater than the first voltage swing;
a coupling component operable to selectively couple a third node with the second node based at least in part on whether the voltage of the second node is below a voltage threshold;
a comparison component operable to generate a signal indicative of the logic value based at least in part on a comparison of a voltage at the third node with a reference voltage; and
a capacitor coupled with the second node and a control signal, and wherein the voltage of the second node is operable to be adjusted based at least in part on the control signal.

9. The apparatus of claim 8, further comprising:
a second capacitor coupled with the third node and a second control signal, and wherein the voltage of the third node is operable to be adjusted based at least in part on the second control signal; and a third capacitor coupled with a reference node and the second control signal, wherein the voltage of the third node is operable to be adjusted based at least in part on the second control signal.

10. An apparatus, comprising:
a first gain component coupled with a first node and a second node, wherein the first node is operable to be coupled with a memory cell, and wherein the first gain component is operable to adjust a voltage of the second node based at least in part on a voltage of the first node,
a precharge component operable to set a voltage of a third node to a first voltage, and
a second gain component comprising a transistor coupled with the second node and the third node operable to:
adjust the voltage of the third node to a second voltage when a differential between a bias voltage at a gate of the second gain component and the voltage of the second node satisfies a voltage threshold; and
maintain the voltage of the third node at the first voltage when the differential between the bias voltage and the voltage of the second node does not satisfy the voltage threshold; and
a comparison component operable to indicate a logic value associated with the memory cell based at least in part on a comparison of the voltage of the third node to a reference voltage, wherein the reference voltage is between the first voltage and the second voltage.

11. The apparatus of claim 10, wherein the transistor is operable to selectively couple the second node with the third node based at least in part on the differential between the bias voltage and the voltage of the second node.

12. A method, comprising:
coupling a memory cell with a first node, wherein a voltage at the first node is based at least in part on the memory cell being coupled with the first node and a logic value stored by the memory cell;
coupling, after the memory cell is coupled with the first node, the first node with a second node, wherein a voltage at the second node is based at least in part on the first node being coupled with the second node and the voltage at the first node;
biasing a gate of a transistor at a bias voltage;
coupling, after the first node is coupled with the second node, the second node with a third node based at least in part on the voltage at the second nod; a voltage threshold, and a differential between the bias voltage and the voltage at the second node satisfying the voltage threshold;
comparing, after the third node is coupled with the second node, a voltage at the third node with a reference voltage; and
generating, based at least in part on the comparing, a signal indicative of the logic value stored by the memory cell.

13. The method of claim 12, wherein coupling the second node with the third node comprises:
coupling the second node with the third node based at least in part on the voltage at the second node being below the voltage threshold.

14. The method of claim 12, wherein the logic value stored by the memory cell comprises a second logic value, further comprising:
precharging, before the first node is coupled with the second node, the third node to a first voltage associated with a first logic value.

15. The method of claim 14, wherein the voltage at the third node changes to a second voltage associated with the second logic value based at least in part on the second node being coupled with the third node.

16. The method of claim 12, wherein the transistor is operable to isolate the third node from the second node if the differential between the bias voltage and the voltage at the second node is below the voltage threshold.

17. The method of claim 12, wherein biasing the gate of the transistor to the bias voltage comprises:
adjusting a voltage of the gate of the transistor to the bias voltage after the first node is coupled with the second node.

18. The method of claim 12, wherein the bias voltage is based at least in part on a configurable parameter.

19. The method of claim 12, further comprising:
adjusting the bias voltage based at least in part on a temperature of a device that includes the memory cell.

20. The method of claim 12, wherein, after the first node is coupled with the second node, the voltage at the second node is based at least in part on a first capacitance associated with the first node, a second capacitance associated with the second node, and charge sharing between the first node and the second node.

21. The method of claim 12, further comprising:
adjusting the voltage of the second node before coupling the second node with the third node.

22. A method, comprising:
coupling a memory cell with a first node, wherein a voltage at the first node is based at least in part on the memory cell being coupled with the first node and a logic value stored by the memory cell;
coupling, after the memory cell is coupled with the first node, the first node with a second node, wherein a voltage at the second node is based at least in part on the first node being coupled with the second node and the voltage at the first node;
coupling, after the first node is coupled with the second node, the second node with a third node based at least in part on the voltage at the second node and a voltage threshold;
decoupling the third node from the second node, wherein decoupling the third node from the second node occurs before the comparing;
comparing, after the third node is coupled with the second node, a voltage at the third node with a reference voltage; and
generating, based at least in part on the comparing, a signal indicative of the logic value stored by the memory cell.

23. A method, comprising:
coupling a memory cell with a first node, wherein a voltage at the first node is based at least in part on the memory cell being coupled with the first node and a logic value stored by the memory cell;
coupling, after the memory cell is coupled with the first node, the first node with a second node, wherein a voltage at the second node is based at least in part on the first node being coupled with the second node and the voltage at the first node;
coupling, after the first node is coupled with the second node, the second node with a third node based at least in part on the voltage at the second node and a voltage threshold, wherein after the second node is coupled with the third node, the voltage at the second node is based at least in part on a first capacitance associated with the second node, a second capacitance associated with the third node, and charge sharing between the second node and the third node;

comparing, after the third node is coupled with the second node, a voltage at the third node with a reference voltage; and generating, based at least in part on the comparing, a signal indicative of the logic value stored by the memory cell.

\* \* \* \* \*